United States Patent
David et al.

(10) Patent No.: US 8,292,693 B2
(45) Date of Patent: *Oct. 23, 2012

(54) USING OPTICAL METROLOGY FOR WAFER TO WAFER FEED BACK PROCESS CONTROL

(75) Inventors: Jeffrey Drue David, San Jose, CA (US); Harry Q. Lee, Los Altos, CA (US); Boguslaw A. Swedek, Cupertino, CA (US); Dominic J. Benvegnu, La Honda, CA (US); Zhize Zhu, Cupertino, CA (US); Wen-Chiang Tu, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 333 days.

This patent is subject to a terminal disclaimer.

(21) Appl. No.: 12/625,480

(22) Filed: Nov. 24, 2009

(65) Prior Publication Data

US 2010/0130100 A1    May 27, 2010

Related U.S. Application Data

(60) Provisional application No. 61/118,135, filed on Nov. 26, 2008.

(51) Int. Cl.
*B24B 49/00* (2012.01)
*B24B 51/00* (2006.01)
*B24B 1/00* (2006.01)
*C23F 1/00* (2006.01)
*H01L 21/306* (2006.01)
*H01L 21/302* (2006.01)
*H01L 21/461* (2006.01)
*G01N 21/55* (2006.01)
*G01B 11/06* (2006.01)
*G06F 19/00* (2011.01)

(52) U.S. Cl. ............. 451/5; 451/6; 451/41; 156/345.13; 156/345.16; 356/448; 356/632; 438/8; 438/692; 700/121; 700/164

(58) Field of Classification Search .................. 700/121, 700/160, 164; 451/5, 6, 41; 438/7, 8, 692; 356/445, 448, 630, 632; 156/345.12, 345.13, 156/345.15, 345.16
See application file for complete search history.

(56) References Cited

U.S. PATENT DOCUMENTS

| | | | | |
|---|---|---|---|---|
| 6,074,517 A * | 6/2000 | Taravade | .................. | 156/345.13 |
| 6,111,634 A | 8/2000 | Pecen et al. | | |
| 6,241,583 B1 * | 6/2001 | White | .............................. | 451/41 |
| 6,425,801 B1 * | 7/2002 | Takeishi et al. | .................... | 451/5 |

(Continued)

FOREIGN PATENT DOCUMENTS

JP    2002-166360    6/2002

(Continued)

*Primary Examiner* — Crystal J Barnes-Bullock
(74) *Attorney, Agent, or Firm* — Fish & Richardson P.C.

(57) ABSTRACT

A method of controlling the polishing of a substrate includes polishing a substrate on a first platen using a first set of parameters, obtaining first and second sequences of measured spectra from first and second regions of the substrate with an in-situ optical monitoring system, generating first and second sequences of values from the first and second sequences of measured spectra, fitting first and second linear functions to the first and second sequences of values, determining a difference between the first linear function and the second linear function, adjusting at least one parameter of the first set of parameters based on the difference, and polishing the second substrate on the first platen using the adjusted parameter.

24 Claims, 9 Drawing Sheets

U.S. PATENT DOCUMENTS

| | | |
|---|---|---|
| 6,503,361 B1 | 1/2003 | Nyui et al. |
| 6,580,508 B1 * | 6/2003 | Chen et al. .................... 356/445 |
| 6,621,584 B2 * | 9/2003 | Pecen et al. .................... 356/630 |
| 6,706,140 B2 * | 3/2004 | Hsu et al. ................. 156/345.13 |
| 6,776,692 B1 | 8/2004 | Zuniga et al. |
| 6,939,198 B1 | 9/2005 | Swedek et al. |
| 7,008,875 B2 | 3/2006 | Birang et al. |
| 7,024,268 B1 * | 4/2006 | Bennett et al. ................ 700/121 |
| 7,074,109 B1 * | 7/2006 | Bennett et al. .................... 451/5 |
| 7,086,929 B2 * | 8/2006 | Wiswesser et al. ............... 451/6 |
| 7,097,534 B1 | 8/2006 | Yampolskiy et al. |
| 7,195,535 B1 * | 3/2007 | Swedek et al. .................... 451/5 |
| 7,409,260 B2 * | 8/2008 | David et al. ................... 700/160 |
| 7,774,086 B2 * | 8/2010 | David et al. ................... 700/160 |
| 7,927,184 B2 * | 4/2011 | Finarov ............................ 451/6 |
| 8,039,397 B2 * | 10/2011 | David et al. ................... 438/692 |
| 2002/0013007 A1 * | 1/2002 | Hasegawa et al. ................ 438/8 |
| 2007/0042675 A1 | 2/2007 | Benvegnu et al. |
| 2007/0224915 A1 | 9/2007 | David et al. |
| 2008/0206993 A1 | 8/2008 | Lee et al. |
| 2010/0120331 A1 * | 5/2010 | Carlsson et al. .................. 451/5 |
| 2010/0129939 A1 | 5/2010 | David et al. |
| 2010/0297916 A1 | 11/2010 | David et al. |
| 2011/0256805 A1 * | 10/2011 | David et al. ....................... 451/5 |
| 2011/0281501 A1 * | 11/2011 | Qian et al. ........................ 451/5 |

FOREIGN PATENT DOCUMENTS

| | | |
|---|---|---|
| KR | 10-0434189 | 6/2004 |

* cited by examiner

USING OPTICAL METROLOGY FOR WAFER TO WAFER FEED BACK PROCESS CONTROL

CROSS-REFERENCE TO RELATED APPLICATIONS

This application claims priority to U.S. Provisional Application Ser. No. 61/118,135, filed on Nov. 26, 2008.

BACKGROUND

1. Technical Field

This specification relates to the monitoring and control of a chemical mechanical polishing process.

2. Description of the Related Art

Sub-quarter micron multi-level metallization is one of the key technologies for the next generation of ultra large-scale integration (ULSI). The multilevel interconnects that lie at the heart of this technology require planarization of interconnect features formed in high aspect ratio apertures, including contacts, vias, trenches and other features. Reliable formation of these interconnect features is very important to the success of ULSI and to the continued effort to increase circuit density and quality on individual substrates and die.

In the fabrication of integrated circuits and other electronic devices, multiple layers of conducting, semiconducting, and dielectric materials are deposited on or removed from a surface of a substrate. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the substrate may become non-planar across its surface and require planarization. An example of a non-planar process is the deposition of copper films with an ECP process in which the copper topography simply follows the already existing non-planar topography of the wafer surface, especially for lines wider than 10 microns. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization is also useful in forming features on a substrate by removing excess deposited material used to fill the features and to provide an even surface for subsequent levels of metallization and processing.

Chemical Mechanical Planarization, or Chemical Mechanical Polishing (CMP), is a common technique used to planarize substrates. CMP utilizes a chemical composition, such as slurries or other fluid medium, for selective removal of materials from substrates. In conventional CMP techniques, a substrate carrier or polishing head is mounted on a carrier assembly and positioned in contact with a polishing pad in a CMP apparatus. The carrier assembly provides a controllable pressure to the substrate, thereby pressing the substrate against the polishing pad. The pad is moved relative to the substrate by an external driving force. The CMP apparatus affects polishing or rubbing movements between the surface of the substrate and the polishing pad while dispersing a polishing composition to affect chemical activities and/or mechanical activities and consequential removal of materials from the surface of the substrate.

An objective of CMP is to remove a predictable amount of material while achieving uniform surface topography both within each wafer and from wafer to wafer when performing a batch polishing process.

Therefore, there is a need for a polishing process which accurately and reliably removes a predictable amount of material while achieving uniform surface topography.

SUMMARY

In one aspect, a method of controlling the chemical mechanical polishing of a substrate includes polishing a substrate on a first platen using a first set of polishing parameters, obtaining a plurality of measured spectra from at least two zones of the substrate by in-situ optical monitoring during polishing, comparing the plurality of measured spectra with a reference spectrum to evaluate the thickness of each of the at least two zones of the substrate, comparing a thickness of a first zone of the at least two zones with a thickness of a second zone of the at least two zones, determining whether the thickness of the first zone of the at least two zones falls within a predetermined range of the thickness of the second zone of the at least two zones, and if the thickness does not fall within the predetermined range, at least one of a) adjusting at least one polishing parameter of the first set of polishing parameters and polishing a second substrate on the first platen using the adjusted polishing parameters, or b) adjusting at least one polishing parameter of a second set of polishing parameters and polishing the substrate on a second platen using the adjusted polishing parameters.

Implementations can include one or more of the following features.

A plurality of measured spectra may be obtained from at least two zones of the second substrate by in-situ optical monitoring during polishing, the plurality of measured spectra may be compared with a reference spectrum to evaluate the thickness of each of the at least two zones of the second substrate, and a thickness of a first zone of the at least two zones of the second substrate may be compared with a thickness of a second zone of the at least two zones.

Whether the thickness of the first zone of the at least two zones falls within a predetermined range of the thickness of the second zone of the at least two zones may be determined, and if the thickness does not fall within the predetermined range, at least one of re-adjusting at least one polishing parameter of the first set of polishing parameters and polishing a third substrate on the first platen using the re-adjusted polishing parameters, or b) adjusting at least one polishing parameter of the second set of polishing parameters and polishing the second substrate on a second platen using the adjusted polishing parameters.

Obtaining a plurality of measured spectra from at least two zones of the substrate may include illuminating the substrate with white light and obtaining spectra of light reflected from the substrate.

Adjusting the polishing parameter may include adjusting the polishing pressure.

The thickness may be a relative thickness, an index value, and/or a final thickness.

Evaluating the thickness of the substrate may be performed using robust line fitting techniques.

At least one polishing parameter of the first set of polishing parameters may be adjusted and the second substrate may be polished on the first platen using the adjusted polishing parameters.

At least one polishing parameter of the second set of polishing parameters may be adjusted, and the substrate may be polished on the second platen using the adjusted polishing parameters.

In another aspect, a method of controlling the chemical mechanical polishing of a substrate includes polishing a substrate on a first platen using a first set of polishing parameters, obtaining a first sequence of measured spectra with an in-situ optical monitoring system, each measured spectrum from the first sequence of measured spectra being a spectrum of light reflected from a first region of the substrate, generating a first sequence of values from the first sequence of measured spectra, fitting a first linear function to the first sequence of values, obtaining a second sequence of measured spectra with the in-situ optical monitoring system, each measured spectrum from the second sequence of measured spectra being a spectrum of light reflected from a second region of the substrate, generating a second sequence of values from the second sequence of measured spectra, fitting a second linear function to the second sequence of values, determining a difference between the first linear function and the second linear function, adjusting at least one polishing parameter of the first set of polishing parameters based on the difference so as to reduce an expected difference between an expected first linear function for the first region and an expected second linear function for the second region during polishing of a second substrate on the first platen, and polishing the second substrate on the first platen using the adjusted polishing parameter.

Implementations can include one or more of the following features.

The first region may be a control region and the second region may be a reference region, and polishing of the first substrate at the first platen may be halted based on the second linear function reaching a target value.

Determining the difference may include determining a first difference between a first time that the first linear function crosses a starting value and a second time that the second linear function reaches the target value. Determining the difference may further include determining a second difference between the target value and the starting value.

The polishing parameter may be pressure.

Adjusting the at least one polishing parameter may includes calculating a desired polishing rate for the second substrate at the first platen from the first difference and the second difference.

MZD1 may equal (RE1−RSZ1)/(TE1−TZS1), where MZD1 is the desired polishing rate, RE1 is the target value, RSZ1 is the starting value, TE1 is the second time that the second linear function reaches the target value, and TZS1 is the first time that the first linear function crosses the starting value.

Adjusting the polishing rate may include multiplying a pressure by a ratio of the desired polishing rate for the second substrate at the first platen to the polishing rate of the substrate at the first platen.

The pressure may be the prior pressure for the control region for polishing of the first substrate.

Adjusting the at least one polishing parameter may include adjusting a polishing parameter for the control region.

The difference in time may be measured as a difference in platen rotations.

Generating a first sequence of values may include, for each measured spectrum, determining a best fitting reference spectrum from a library of reference spectra, and determining a value associated with the best fitting reference spectrum.

The value comprises an index value or a thickness value.

Obtaining a plurality of measured spectra from at least two zones of the substrate may include illuminating the substrate with white light and obtaining spectra of light reflected from the substrate.

In another aspect, a method of controlling the chemical mechanical polishing of a substrate includes polishing a substrate on a first platen using a first set of polishing parameters, obtaining a first sequence of measured spectra with an in-situ optical monitoring system, each measured spectrum from the first sequence of measured spectra being a spectrum of light reflected from a first region of the substrate, generating a first sequence of values from the first sequence of measured spectra, fitting a first linear function to the first sequence of values, obtaining a second sequence of measured spectra with the in-situ optical monitoring system, each measured spectrum from the second sequence of measured spectra being a spectrum of light reflected from a second region of the substrate, generating a second sequence of values from the second sequence of measured spectra, fitting a second linear function to the second sequence of values, determining a difference between the first linear function and the second linear function, adjusting at least one polishing parameter of a second set of polishing parameters based on the difference so as to reduce an expected difference between an expected first linear function for the first region and an expected second linear function for the second region during polishing of the substrate on the second platen, and polishing the substrate on the second platen using the adjusted polishing parameter.

Implementations can include one or more of the following features.

The first region may be a control region and the second region may be a reference region, and polishing of the first substrate at the first platen may be halted based on the second linear function reaching a target value.

Determining the difference may include determining a difference between a first time that the first linear function reaches the target value and a second time that the second function reaches the target value.

Adjusting the at least one polishing parameter may include multiplying the difference in time by a ratio of the rotation rate of the first platen to the rotation rate of the second platen.

The polishing parameter may be pressure.

Adjusting the at least one polishing parameter may include calculating an expected polishing rate for the substrate at the second platen from a second target value, a second target time and the difference in time.

MZD2 may equal RE2/(TE2−TZS2), where MZD2 is the expected polishing rate, RE2 is the second target value, TE2 is the second target time, and TZS2 is the difference in time multiplied by the ratio of the rotation rate of the first platen to the rotation rate of the second platen.

Adjusting the polishing rate may include multiplying a pressure by a ratio of expected polishing rate to a prior polishing rate.

The pressure may be a pressure for the reference region.

Adjusting the at least one polishing parameter may include adjusting a polishing parameter for the control region.

The difference in time may be measured as a difference in platen rotations.

Generating a first sequence of values may include, for each measured spectrum, determining a best fitting reference spectrum from a library of reference spectra, and determining a value associated with the best fitting reference spectrum.

The value may be an index value or a thickness value.

Obtaining a plurality of measured spectra from at least two zones of the substrate may include illuminating the substrate with white light and obtaining spectra of light reflected from the substrate.

In another aspect, a computer program product, tangibly embodied on a computer readable media, may include instructions for causing a processor to control a chemical mechanical polisher to perform operations of any of the methods forth above.

In another aspect, a system for chemical mechanical polishing may include a first rotatable platen for supporting a polishing surface, a light source in the platen, a light detector in the platen, a carrier head configured to hold a substrate against the polishing surface and move the substrate so that light from the light source is directed onto the surface of the substrate and light reflected from the substrate is detected by the light detector, a controller configured to receive a signal from the light detector, wherein the controller is further configured to perform operations of any of the methods set forth above.

BRIEF DESCRIPTION OF THE DRAWINGS

So that the manner in which the above recited features can be understood in detail, a more particular description, briefly summarized above, may be had by reference to various implementations, some of which are illustrated in the appended drawings. It is to be noted, however, that the appended drawings illustrate only typical implementations and are therefore not to be considered limiting of the scope of the claims, for there may be other equally effective implementations.

Figure 1:
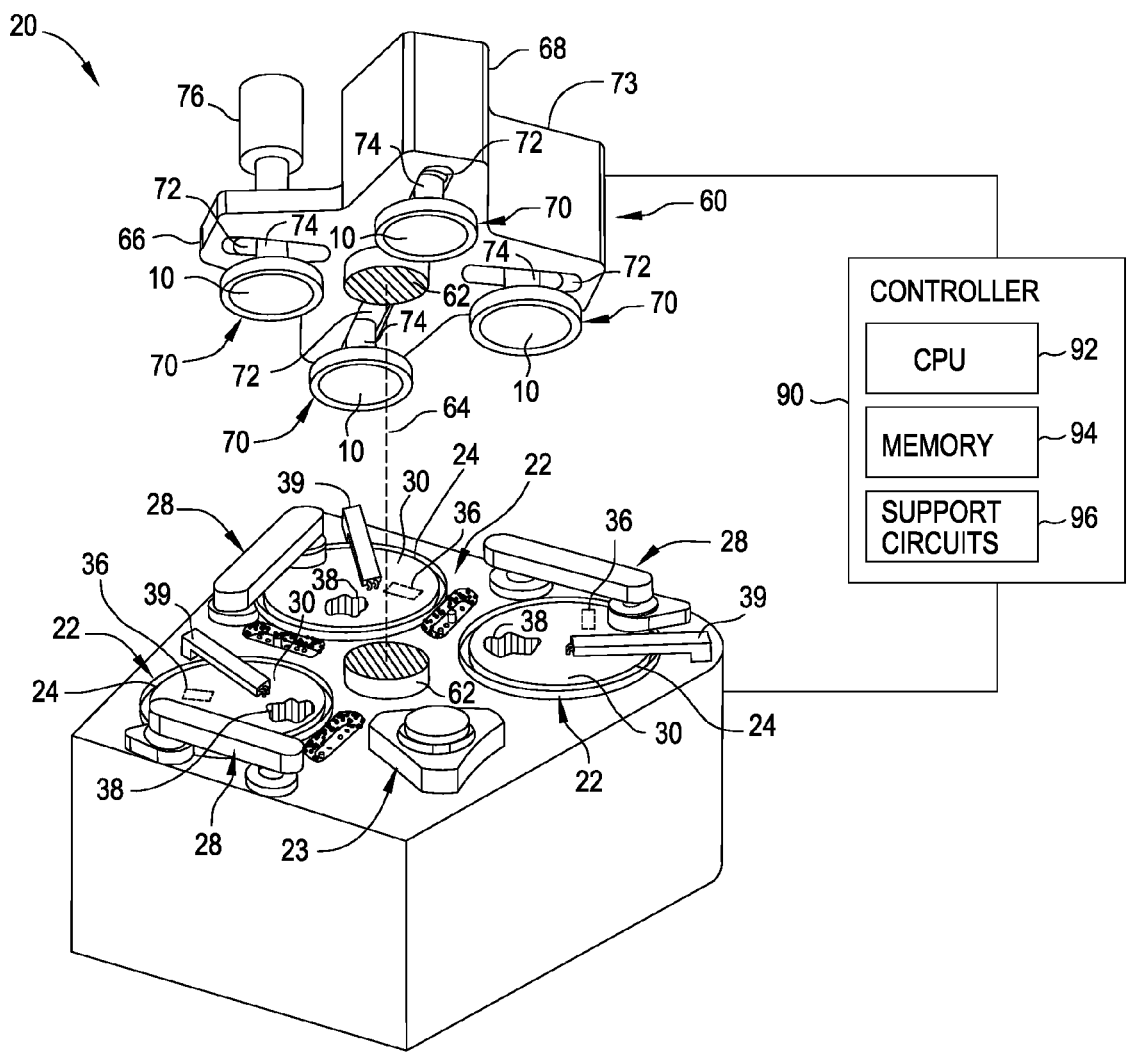
FIG. 1 is a schematic cross-sectional view of a chemical mechanical polishing apparatus.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Implementations described herein relate to methods and optical systems for polishing substrates and determining relative thickness and a polishing endpoint. An optical detector is used to obtain spectra from a substrate during polishing on a platen. The spectra are compared to spectra in a library. The comparison can be done using various techniques, such as the least sum of squared matching techniques, which are described in U.S. Patent Publication No. 2007-0042675, and U.S. Patent Publication No. 2007-0224915. If each spectrum in the library is assigned an index number, the matching index numbers can be plotted according to time and a line fit to the plotted index numbers using robust line fitting techniques, which are described in U.S. Patent Publication No. 2008-0206993. When the line intersects the index corresponding to a target spectrum the target endpoint is reached and polishing can be stopped.

Information regarding the relative thickness and endpoint time of various regions of the substrate can be used to adjust polishing parameters, such as the polishing pressure, for each defined region on the substrate so that the different regions reach a target thickness at the same time, to obtain a more uniform polish across the surface of the substrate when polishing is halted simultaneously across the substrate. However, such in-situ modification of polishing parameters may not work well when polish times are short and/or there is not enough time due to poor sampling rates. The implementations described herein use the information regarding the relative thickness and endpoint time to modify polishing parameters for both subsequent substrates polished on the same platen and for the same substrate as the substrate is polished on additional platens.

In some implementations, the relative thickness and endpoint time based on spectra of various regions of a substrate polished on a first platen (platen x) can be used to modify the polishing parameters for the same substrate as the substrate is polished on additional platens (platen x+1). In other implementations, the relative thickness and endpoint time based on spectra of various regions of a first substrate polished on a platen (platen x) can be used to modify the polishing parameters for a second substrate polished on the same platen (platen x). In yet other implementations, the relative thickness and endpoint time based on spectra of various regions of a substrate polished on a first platen (platen x) is used in conjunction with the relative thickness and endpoint time based on the spectra of various regions of the same substrate polished on a second platen (x+1) and used to modify the polishing parameters for subsequent substrates polished on the first platen and/or second platen. Gain factors and other signal processing control techniques may be used to achieve better performance.

While the particular apparatus in which the implementations described herein can be practiced is not limited, it is particularly beneficial to practice the implementations in a REFLEXION LK CMP system and MIRRA MESA® system sold by Applied Materials, Inc., Santa Clara, Calif. Additionally, CMP systems available from other manufacturers may also benefit from implementations described herein. Implementations described herein may also be practiced on overhead circular track polishing systems.

FIG. 1 shows a chemical mechanical polishing apparatus 20 that can polish one or more substrates 10. Polishing apparatus 20 includes a series of polishing stations 22 and a transfer station 23. Transfer station 23 transfers the substrates between carrier heads 70 and a loading apparatus (not shown).

Each polishing station 22 includes a rotatable platen 24 on which is placed a polishing pad 30. The first and second stations 22 can include a two-layer polishing pad with a hard durable outer surface or a fixed-abrasive pad with embedded abrasive particles. The final polishing station 22 can include a relatively soft pad. Each polishing station 22 can also include a pad conditioner apparatus 28 to maintain the condition of the polishing pad so that it will effectively polish substrates 10.

A rotatable multi-head carousel 60 supports four carrier heads 70. The carousel 60 is rotated by a central post 62 about a carousel axis 64 by a carousel motor assembly (not shown)

to orbit the carrier heads 70 and the substrates 10 attached thereto between polishing stations 22 and transfer station 23. Three of the carrier heads 70 receive and hold substrates 10, and polish them by pressing them against the polishing pads 30. Meanwhile, one of the carrier heads 70 receives a substrate 10 from and delivers a substrate 10 to transfer station 23.

Each carrier head 70 is connected by a carrier drive shaft 74 to a carrier head rotation motor 76 (shown by the removal of one quarter of cover 68) so that each carrier head 70 can independently rotate about its own axis. In addition, each carrier head 70 independently laterally oscillates in a radial slot 72 formed in carousel support plate 66. A description of a suitable carrier head 70 can be found in U.S. Pat. No. 6,422,927.

A slurry 38 containing a reactive agent (e.g., deionized water for oxide polishing) and a chemically-reactive catalyzer (e.g., potassium hydroxide for oxide polishing) can be supplied to the surface of the polishing pad 30 by a slurry supply port or a combined slurry/rinse arm 39. If the polishing pad 30 is a standard pad, the slurry 38 can also include abrasive particles (e.g., silicon dioxide for oxide polishing). An optical access, for example, a window 36, is included in the polishing pad 30 and is positioned such that it passes beneath substrate 10 during a portion of the platen's rotation, regardless of the translational position of the carrier head 70. In certain the window 36 and related sensing methods may be used for an endpoint detection process.

To facilitate control of the polishing apparatus 20 and processes performed thereon, a controller 90 comprising a central processing unit (CPU) 92, memory 94, and support circuits 96, is connected to the polishing apparatus 20. The CPU 92 may be one of any form of computer processor that can be used in an industrial setting for controlling various drives and pressures. The memory 94 is connected to the CPU 92. The memory 94, or computer-readable medium, may be one or more of readily available memory such as random access memory (RAM), read only memory (ROM), floppy disk, hard disk, or any other form of digital storage, local or remote. The support circuits 96 are connected to the CPU 292 for supporting the processor in a conventional manner. These circuits include cache, power supplies, clock circuits, input/output circuitry, subsystems, and the like.

Figure 2:
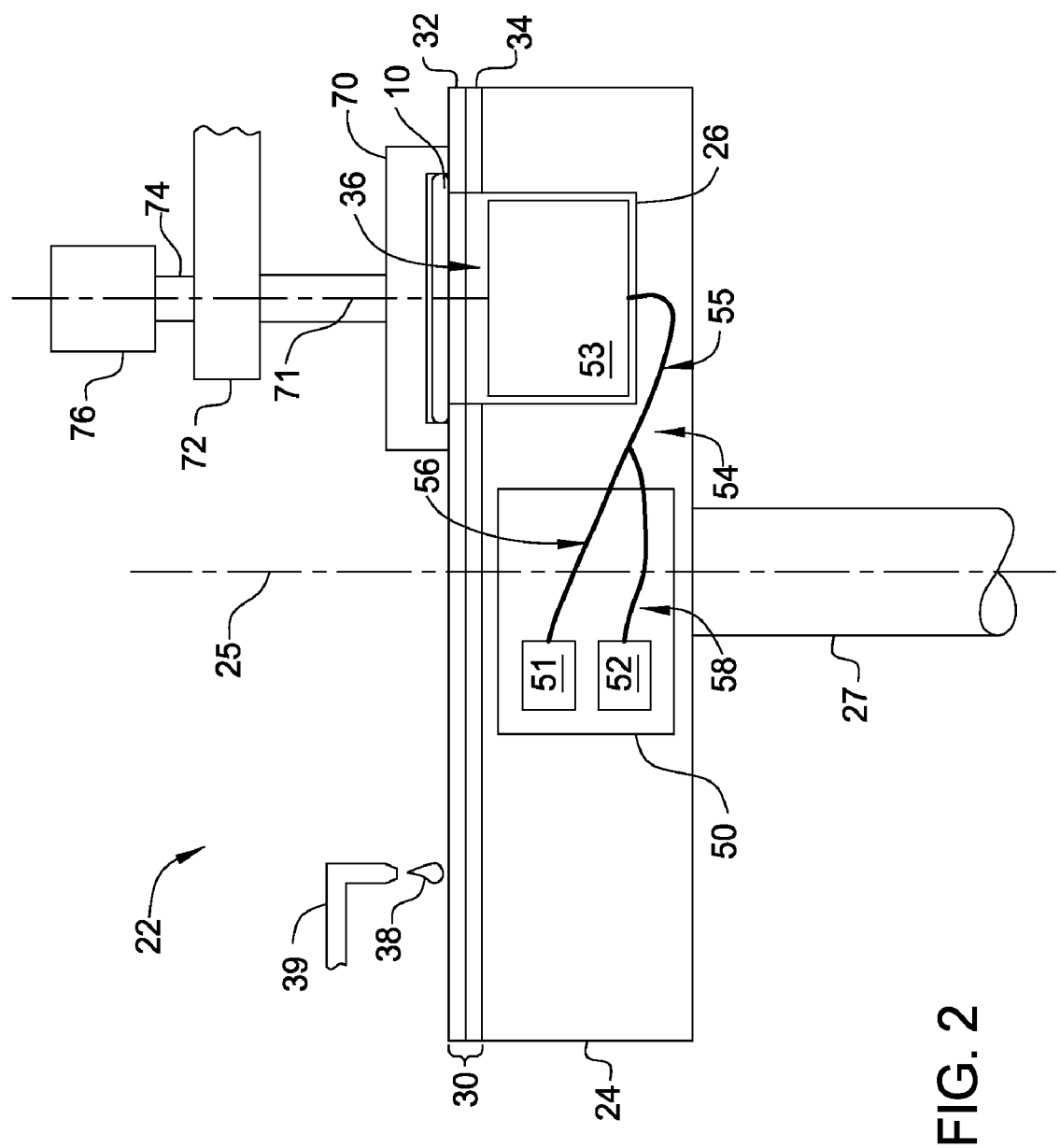
FIG. 2 is a schematic cross-sectional view of a polishing station.

FIG. 2 is a schematic cross-sectional view of a chemical mechanical polishing station 22 operable to polish a substrate 10. The polishing station 22 includes a rotatable disk-shaped platen 24, on which a polishing pad 30 is situated. The platen 24 is operable to rotate about an axis 25. For example, a motor (not shown) can turn a drive shaft 27 to rotate the platen 24. The polishing pad 30 can be detachably secured to the platen 24, for example, by a layer of adhesive. When worn, the polishing pad 30 can be detached and replaced. The polishing pad 30 can be a two-layer polishing pad with an outer polishing layer 32 and a softer backing layer 34.

Optical access through the polishing pad 30 is provided by including an aperture (i.e., a hole that runs through the pad) or a solid window. The solid window can be secured to the polishing pad 30, although in some implementations the solid window can be supported on the platen 24 and project into an aperture in the polishing pad 30. The polishing pad 30 is usually placed on the platen 24 so that the aperture or window overlies an optical head 53 situated in a recess 26 of the platen 24. The optical head 53 consequently has optical access through the aperture or window to a substrate being polished. The optical 53 head is further described below.

The window 36 can be, for example, a rigid crystalline or glassy material, e.g., quartz or glass, or a softer plastic material, e.g., silicone, polyurethane or a halogenated polymer (e.g., a fluoropolymer), or a combination of the materials mentioned. The window 36 can be transparent to white light. If a top surface of the solid window 36 is a rigid crystalline or glassy material, then the top surface should be sufficiently recessed from the polishing surface to prevent scratching. If the top surface is near and may come into contact with the polishing surface, then the top surface of the window 36 should be a softer plastic material. In some implementations the solid window 36 is secured in the polishing pad 30 and is a polyurethane window, or a window 36 having a combination of quartz and polyurethane. The window 36 can have high transmittance, for example, approximately 80% transmittance, for monochromatic light of a particular color, for example, blue light or red light. The window 36 can be sealed to the polishing pad 30 so that liquid does not leak through an interface of the window 36 and the polishing pad 30.

A bottom surface of the window 36 can optionally include one or more recesses. A recess can be shaped to accommodate, for example, an end of an optical fiber cable or an end of an eddy current sensor. The recess allows the end of the optical fiber cable or the end of the eddy current sensor to be situated at a distance, from a substrate surface being polished, that is less than a thickness of the window 36. With an implementation in which the window 36 includes a rigid crystalline portion or glass like portion and the recess is formed in such a portion by machining, the recess is polished so as to remove scratches caused by the machining. Alternatively, a solvent and/or a liquid polymer can be applied to the surfaces of the recess to remove scratches caused by machining. The removal of scratches usually caused by machining reduces scattering and can improve the transmittance of light through the window 36. Implementations of the window 36 are described in U.S. Patent Publication No. 2007/0042675.

The above described window 36 and polishing pad 30 can be manufactured using a variety of techniques. The backing layer 34 of the polishing pad 30 can be attached to its outer polishing layer 32, for example, by adhesive. The aperture that provides optical access can be formed in the pad 30, e.g., by cutting or by molding the pad 30 to include the aperture, and the window 36 can be inserted into the aperture and secured to the pad 30, e.g., by an adhesive. Alternatively, a liquid precursor of the window 36 can be dispensed into the aperture in the pad 30 and cured to form the window 36. Alternatively, a solid transparent element, e.g., the above described crystalline or glass like portion, can be positioned in liquid pad material, and the liquid pad material can be cured to form the pad 30 around the transparent element. In either of the later two cases, a block of pad material can be formed, and a layer of polishing pad 30 with the molded window 36 can be scythed from the block.

The polishing station 22 can include a flushing system to improve light transmission through the optical access. There are different implementations of the flushing system. With implementations of the polishing station 22 in which the polishing pad 30 includes an aperture instead of a solid window, the flushing system is implemented to provide a laminar flow of a fluid, e.g., a gas or liquid, across a top surface of the optical head 53. (The top surface can be a top surface of a lens included in the optical head 53.) The laminar flow of fluid across the top surface of the optical head 53 can sweep opaque slurry out of the optical access and/or prevent slurry from drying on the top surface and, consequently, improves transmission through the optical access. With implementations in which the polishing pad 30 includes a window 36 instead of an aperture, the flushing system is implemented to direct a flow of gas at a bottom surface of the window 36. The flow of gas can prevent condensation from forming at the bottom surface of the window 36 which would otherwise impede optical access.

Returning to FIG. 1, the polishing station 22 includes a combined slurry/rinse arm 39. During polishing, the arm 39 is operable to dispense slurry 38 containing a liquid and a pH adjuster. Alternatively, the polishing station 22 includes a slurry port operable to dispense slurry onto polishing pad 30.

The polishing station 22 includes the carrier head 70 operable to hold the substrate 10 against the polishing pad 30. The carrier head 70 is suspended from a support structure 73, for example, a carousel 60, and is connected by a carrier drive shaft 74 to a carrier head rotation motor 76 so that the carrier head can rotate about an axis 71. In addition, the carrier head 70 can oscillate laterally in a radial slot formed in the support structure 73. In operation, the platen 24 is rotated about its central axis 25, and the carrier head 70 is rotated about its central axis 71 and translated laterally across the top surface of the polishing pad 30.

The polishing station 22 also includes an optical monitoring system, which can be used to determine a polishing endpoint as discussed below. The optical monitoring system includes a light source 51 and a light detector 52. Light passes from the light source 51, through the window 36 in the polishing pad 30, impinges and is reflected from the substrate 10 back through the window 36, and travels to the light detector 52.

A bifurcated optical cable 54 can be used to transmit the light from the light source 51 to the window 36 and back from the window 36 to the light detector 52. The bifurcated optical cable 54 can include a "trunk" 55 and two "branches" 56 and 58.

As mentioned above, the platen 24 includes the recess 26, in which the optical head 53 is situated. The optical head 53 holds one end of the trunk 55 of the bifurcated fiber cable 54, which is configured to convey light to and from a substrate surface being polished. The optical head 53 can include one or more lenses or a window overlying the end of the bifurcated fiber cable 54. Alternatively, the optical head 53 can merely hold the end of the trunk 55 adjacent the window in the polishing pad. The optical head 53 can hold the above-described nozzles of the flushing system. The optical head 53 can be removed from the recess 26 as required, for example, to effect preventive or corrective maintenance.

The platen 24 includes a removable in-situ monitoring module 50. The in-situ monitoring module 50 can include one or more of the following: the light source 51, the light detector 52, and circuitry for sending and receiving signals to and from the light source 51 and light detector 52. For example, the output of the detector 52 can be a digital electronic signal that passes through a rotary coupler, e.g., a slip ring, in the drive shaft 74 to the controller 90 for the optical monitoring system. Similarly, the light source can be turned on or off in response to control commands in digital electronic signals that pass from the controller 90 through the rotary coupler to the module 50.

The in-situ monitoring module can also hold the respective ends of the branch portions 56 and 58 of the bifurcated optical fiber cable 54. The light source is operable to transmit light, which is conveyed through the branch 56 and out the end of the trunk 55 located in the optical head 53, and which impinges on a substrate being polished. Light reflected from the substrate is received at the end of the trunk 55 located in the optical head 53 and conveyed through the branch 58 to the light detector 52.

In some implementations, the bifurcated fiber cable 54 is a bundle of optical fibers. The bundle includes a first group of optical fibers and a second group of optical fibers. An optical fiber in the first group is connected to convey light from the light source 51 to a substrate surface being polished. An optical fiber in the second group is connected to receive light reflecting from the substrate surface being polished and convey the received light to a light detector. The optical fibers can be arranged so that the optical fibers in the second group form an X-like shape that is centered on the longitudinal axis of the bifurcated optical fiber (as viewed in a cross section of the bifurcated fiber cable 54). Alternatively, other arrangements can be implemented. For example, the optical fibers in the second group can form V-like shapes that are mirror images of each other. A suitable bifurcated optical fiber is available from Verity Instruments, Inc. of Carrollton, Tex.

There is usually an optimal distance between the window 36 of the polishing pad 30 and the end of the trunk 55 of bifurcated fiber cable 54 proximate to the window 36 of the polishing pad 30. The distance can be empirically determined and is affected by, for example, the reflectivity of the window 36, the shape of the light beam emitted from the bifurcated fiber cable, and the distance to the substrate being monitored. In some implementations, the bifurcated fiber cable is situated so that the end proximate to the window 36 is as close as possible to the bottom of the window 36 without actually touching the window 36. With this implementation, the polishing station 22 can include a mechanism, e.g., as part of the optical head 53, that is operable to adjust the distance between the end of the bifurcated fiber cable 54 and the bottom surface of the polishing pad window 36. Alternatively, the proximate end of the bifurcated fiber cable is embedded in the window 36.

The light source 51 is operable to emit white light. In some implementations, the white light emitted includes light having wavelengths of 200-800 nanometers. A suitable light source is a xenon lamp or a xenon-mercury lamp.

The light detector 52 can be a spectrometer. A spectrometer is basically an optical instrument for measuring properties of light, for example, intensity, over a portion of the electromagnetic spectrum. A suitable spectrometer is a grating spectrometer. Typical output for a spectrometer is the intensity of the light as a function of wavelength.

Optionally, the in-situ monitoring module 50 can include other sensor elements. The in-situ monitoring module 50 can include, for example, eddy current sensors, lasers, light emitting diodes, and photodetectors. With implementations in which the in-situ monitoring module 50 includes eddy current sensors, the module 50 is usually situated so that a substrate being polished is within working range of the eddy current sensors.

Figure 3:
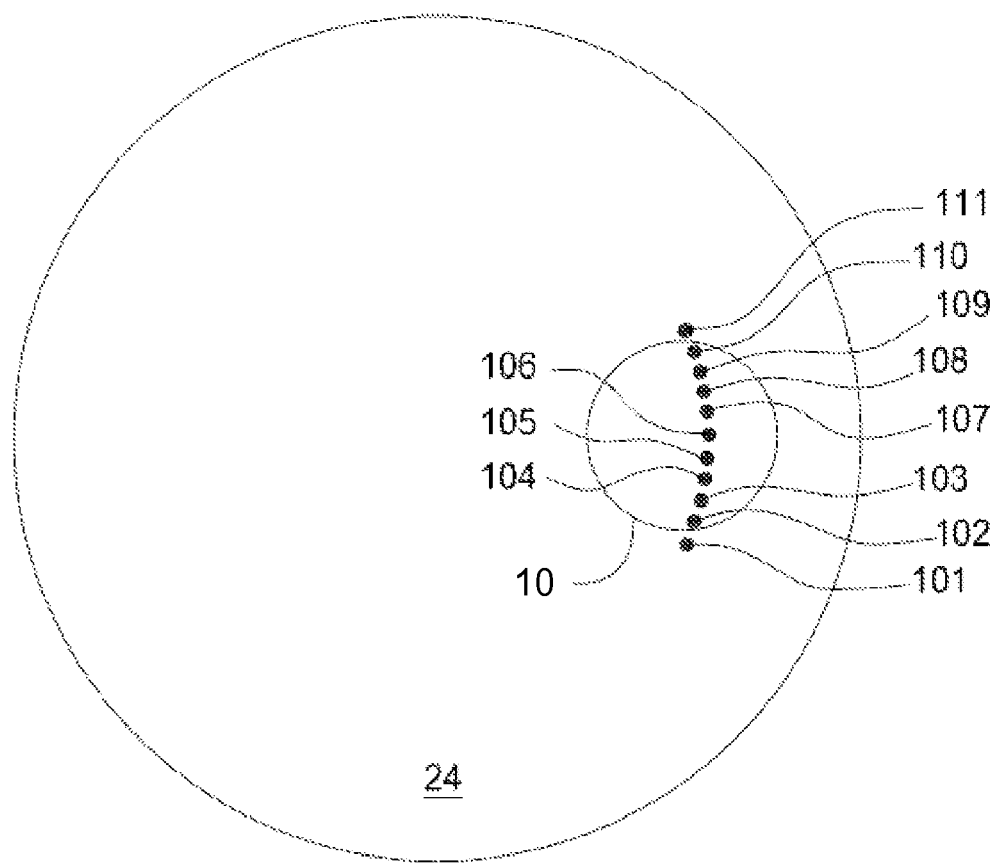
FIG. 3 is an overhead view of a substrate on a platen and shows locations where measurements are taken.

The light source 51 and light detector 52 are connected to the controller 90 to control their operation and to receive their signals. With respect to control, the controller 90 can, for example, synchronize activation of the light source 51 with the rotation of the platen 24. As shown in FIG. 3, the controller 90 can cause the light source 51 to emit a series of flashes starting just before and ending just after the substrate 10 passes over the in-situ monitoring module. (Each of points 101-111 depicted represents a location where light from the in-situ monitoring module impinged and reflected off.) Alternatively, the controller 90 can cause the light source 51 to emit light continuously starting just before and ending just after the substrate 10 passes over the in-situ monitoring module. Although not shown, each time the substrate 10 passes over the monitoring module, the alignment of the substrate 10 with the monitoring module can be different than in the previous pass. Over one rotation of the substrate 10, spectra are obtained from different angular locations on the substrate 10, as well as different radial locations. That is, some spectra are obtained from locations closer to the center of the substrate 10 and some are closer to the edge. The substrate 10 can be sectioned off into radial zones. Three, four, five, six, seven or more zones can be defined on the surface of the substrate 10. In some implementations described herein, spectra are grouped into their corresponding zones.

With respect to receiving signals, the controller 90 can receive, for example, a signal that carries information describing a spectrum of the light received by the light detector 52. The controller 90 can process the signal to determine an endpoint of a polishing step. Without being limited to any particular theory, the spectra of light reflected from the substrate 10 evolve as polishing progresses. Properties of the spectrum of the reflected light change as a thickness of the film changes, and particular spectrums are exhibited by particular thicknesses of the film. The controller 90 can execute logic that determines, based on one or more of the spectra, when an endpoint has been reached. The one or more spectra on which an endpoint determination is based can include a target spectrum, a reference spectrum, or both.

As used in the instant specification, a target spectrum refers to a spectrum exhibited by the white light reflecting from a film of interest when the film of interest has a target thickness. By way of example, a target thickness can be 1, 2, or 3 microns. Alternatively, the target thickness can be zero, for example, when the film of interest is cleared so that an underlying film is exposed.

Figure 4:
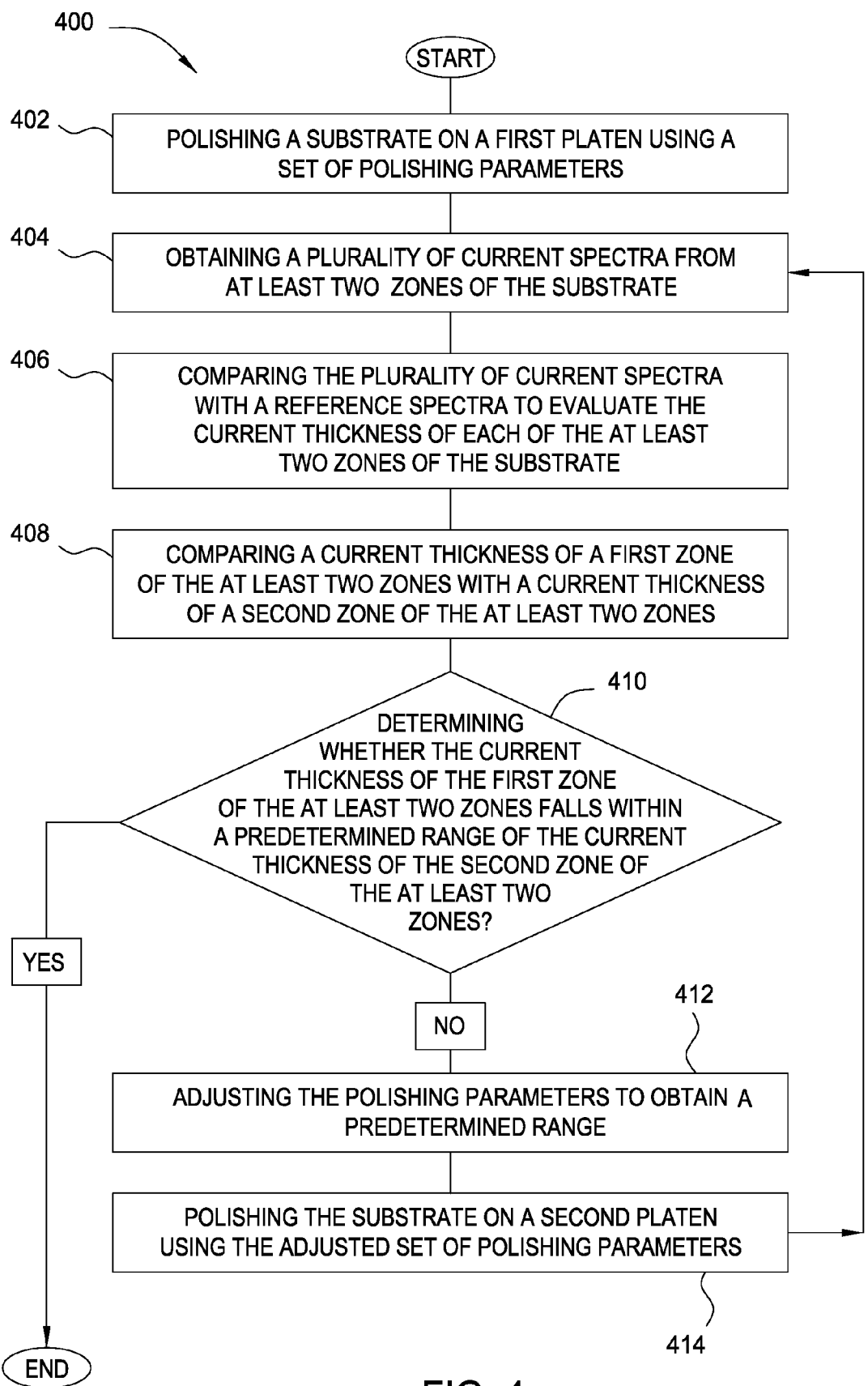
FIG. 4 illustrates a method for polishing a substrate.

FIG. 4 illustrates a method 400 for polishing a substrate according to implementations described herein. The method begins by polishing a substrate 10 on a first platen 24 using a set of polishing parameters (step 402). The substrate 10 may have a material disposed thereon. Exemplary materials may include insulating materials, e.g., oxides, such as silicon oxide. The polishing parameters may include, for example, one or more of the platen rotational speed, the rotational speed of the carrier head, the pressure or downward force applied by the carrier head to the substrate, material removal rate, carrier head sweep frequency, and slurry flow rate.

The substrate 10 is polished with the surface of the polishing pad 30. The substrate 10 is brought into contact with the polishing pad 30, more particularly, the material on the substrate is brought into contact with an upper surface of the polishing pad 30. The polishing pad 30 is rotated relative to the substrate 10, which is also rotated. In some implementations, the polishing process may comprise a multi-step polishing process. For example, bulk material may be removed on a first platen 24 using a high removal rate process with any residual conductive material removed on a second platen 24 using a "soft landing" or low pressure/low removal rate process. In some implementations, the polishing process may be performed on a single platen.

In some implementations, an incoming or pre-polish profile determination is made, for example, by measuring the thickness of a particular substrate material across portions of the substrate 10. The profile determination may include determining the thickness profile of a conductive material across the surface of the substrate 10. A metric indicative of thickness may be provided by any device or devices designed to measure film thickness of semiconductor substrates. Exemplary non-contact devices include iSCAN™ and iMAP™ available from Applied Materials, Inc. of Santa Clara, Calif., which scan and map the substrate, respectively. The pre-polish profile determination may be stored in the controller 90.

A plurality of measured spectra is obtained from at least two zones of the substrate 10 by in-situ optical monitoring during the polishing process (step 404). The plurality of measured spectra can include a plurality, e.g., sequence, of measured spectra from each zone. In some implementations, the substrate is divided into a series of zones. In some implementations, the zones may comprise circular and annular zones, for example, the substrate may be divided into an annular edge zone, an annular middle zone, and a circular center zone. The plurality of measured spectra may be obtained using the in-situ monitoring module 50 as discussed herein. The plurality of measured spectra may be obtained during the polishing process in real-time.

The plurality of measured spectra is compared with a plurality of reference spectra to evaluate the thickness of each of the at least two zones of the substrate 10 (step 406). The reference spectra may be collected while polishing a set-up substrate or series of set-up substrates using similar polishing parameters. The reference spectra may be stored in a spectra library. Alternatively, the library can include spectra that are not collected but rather are generated based on theory. The library can be implemented in the memory of the controller 90 of the polishing apparatus 20. Each reference spectrum in the library has an associated value, such as an index value or a thickness value. For example, the reference spectra are indexed so that each reference spectrum has an index value, e.g., a unique index value, and the index value associated with reference spectrum is stored, e.g., in computer memory. The index values for the reference spectra can be selected to monotonically increase as polishing progresses, e.g., the index values can be proportional to a number of platen rotations or to time. Thus each index value can be a whole number, and the index number can represent the expected platen rotation at which the associated reference spectrum would appear.

Alternatively, rather than storing index values, the computer memory can store thickness values for the reference spectra, with each reference spectrum having an associated thickness value.

In certain implementations, for each measured spectrum, the reference spectrum stored in the library which best fits the measured spectrum is determined. The index value or thickness value associated with the determined reference spectrum is retrieved from memory. Thus, as a sequence of measured spectra is obtained during polishing, a sequence of index values or thicknesses values is generated. For each index value or thickness value, the time or platen rotation at which the corresponding measured spectrum was measured can be stored. A linear function, e.g., a function of time or platen rotation, can be fit to the index values or thickness values, e.g., using robust line fit techniques. The slope of the fitted line defines the polishing rate (in terms of index values or thickness per time or platen rotation). Where the fitted line crosses the current time or platen rotation defines the present index or present thickness for the layer on the substrate. Where the fitted line meets the target index or target thickness defines the endpoint time or rotation. Where the fitted line intersects the time or rotation at which polishing is halted, e.g., a target time or target rotation, defines a final index value or final thickness value. In certain implementations, the index values or thickness values that match the current spectra are plotted, e.g., displayed on monitor, according to time or platen rotation.

The thickness of a first zone of the at least two zones is compared with the thickness of a second zone of the at least two zones (step 408). In the context of methods 400 and 500, the thickness can be an actual thickness, e.g., a thickness value, or a stand-in for the actual thickness, e.g., an index value. In addition, the thickness can be calculated from a sequence, e.g., calculated from the line fit to the sequence of values, e.g., the thickness can be the present index or present thickness, or the thickness can simply be determined from just the most recently measured spectrum, e.g., the thickness can be the thickness value or index value associated with the most recently measured spectrum. In addition, the thickness can also be a thickness determined for the end of the polishing operation at a particular platen, i.e., the thickness can be a "final thickness". Again, the "final thickness" can be an actual thickness or a stand-in for the actual thickness, e.g., the final actual thickness value or final index value, respectively, as discussed above. In some implementations, the present index values of the first and second zones are used. In some implementations, the final index values of the first and second zones are used.

In some implementations, the first zone is a reference zone and the second zone is a control zone. The polishing parameters of the control zone are modified until the thickness of the second zone falls within a predetermined range of the thickness of the reference zone. In some implementations there are three or more zones, e.g., five zones, and the first zone is the reference zone and the other zones are control zones. An annular middle zone between a circular center control zone and the annular outer control zone can be the reference zone.

It is first determined whether the thickness of the first zone of the at least two zones falls within a predetermined range of the thickness of the second zone of the at least two zones (step 410). In some implementations, the predetermined range may be determined by polishing a set-up substrate or series of set-up substrates with profiles similar to each other and to the substrate 10 and using polishing conditions similar to each other and to the polishing process used to polish substrate 10. Data from the set-up substrates may be stored in a computer. In some implementations, the predetermined range can be calculated from the differences between the two zones, e.g., assuming the average thickness of the two zones is equal over multiple substrates, the range could be based on a standard deviation of the thickness differences over these substrates.

If the thickness of the first zone falls within a predetermined range of the thickness of the second zone, e.g., if the final thickness of the first zone falls within a predetermined range of the final thickness of the second zone, then no modification of the polishing parameters for the control zone is necessary and the same set of polishing parameters can be used to polish subsequent additional substrates at the first platen. In addition, if the thickness of the first zone falls within a predetermined range of the thickness of the second zone, e.g., if the final thickness of the first zone falls within a predetermined range of the final thickness of the second zone, then a default set of second polishing parameters for the control zone can be used to polish the substrate 10 at a second platen.

In some implementations, if the thickness of the first zone does not fall within the predetermined range, e.g., if the final thickness of the first zone does not fall within the predetermined range of the final thickness of the second zone, at least one polishing parameter of the first set of polishing parameters for the first zone is adjusted for a subsequent substrate at the first platen to obtain the predetermined range during polishing of the subsequent substrate at the first platen (step 412). In some implementations, at least one polishing parameter of the control zone is modified for the subsequent substrate at the first platen such that the final thickness of the control zone is equivalent to the final thickness of the reference zone at the completion of polishing at the first platen. Thus, these implementations can improve wafer-to-wafer polishing uniformity.

In some implementations, if the thickness of the first zone does not fall within the predetermined range, e.g., if the final thickness of the first zone does not fall within the predetermined range of the final thickness of the second zone, at least one polishing parameter of the second set of polishing parameters for the first zone is adjusted (relative to the default set of second polishing parameters) for the substrate to obtain a second predetermined range between the first zone and the second zone during polishing of the substrate at the second platen (step 412). In some implementations, at least one polishing parameter of the control zone is modified for the substrate at the second platen such that the final thickness of the control zone is equivalent to the final thickness of the reference zone at the completion of polishing of the substrate at the second platen. Thus, these implementations can improve within-wafer polishing uniformity.

In some implementations, at least one polishing parameter for the first zone is adjusted in real-time while polishing of the substrate is performed at the first platen so that the thickness of the control zone becomes equivalent to the thickness of the reference zone. For example, the polishing parameters of the control zone can be modified such that such that the final thickness of the control zone is equivalent to the final thickness of the reference zone at the completion of polishing of the substrate at the first platen.

The substrate 10 is then polished on a second platen 24 using either the default second set of polishing parameters or adjusted second set of polishing parameters (step 414) as determined in step 412. The method may be repeated beginning at step 404 where a plurality of measured spectra is obtained from at least one zone of the substrate 10 (step 404). The method may be repeated until the thickness of the first zone of the substrate falls within the predetermined range.

In some implementations, while the substrate 10 is polished on a second platen 24 using the adjusted second set of polishing parameters in a feed forward process (step 414), the adjusted first set of polishing parameters are used to polish a second substrate on the first platen 24 in a feed backward process. In some implementations, the information gained from polishing the second substrate on the first platen 24 may be used to further adjust the second set of polishing parameters while polishing the second substrate on the second platen and/or to further adjust the first set of polishing parameters while polishing a third substrate on the first platen. In some implementations, the polishing parameters used to polish the second substrate 10 on the first platen 24 are adjusted in real-time based on the polishing of the first substrate 10 on the second platen 24 in a combined feed forward and feed backward process.

Figure 5:
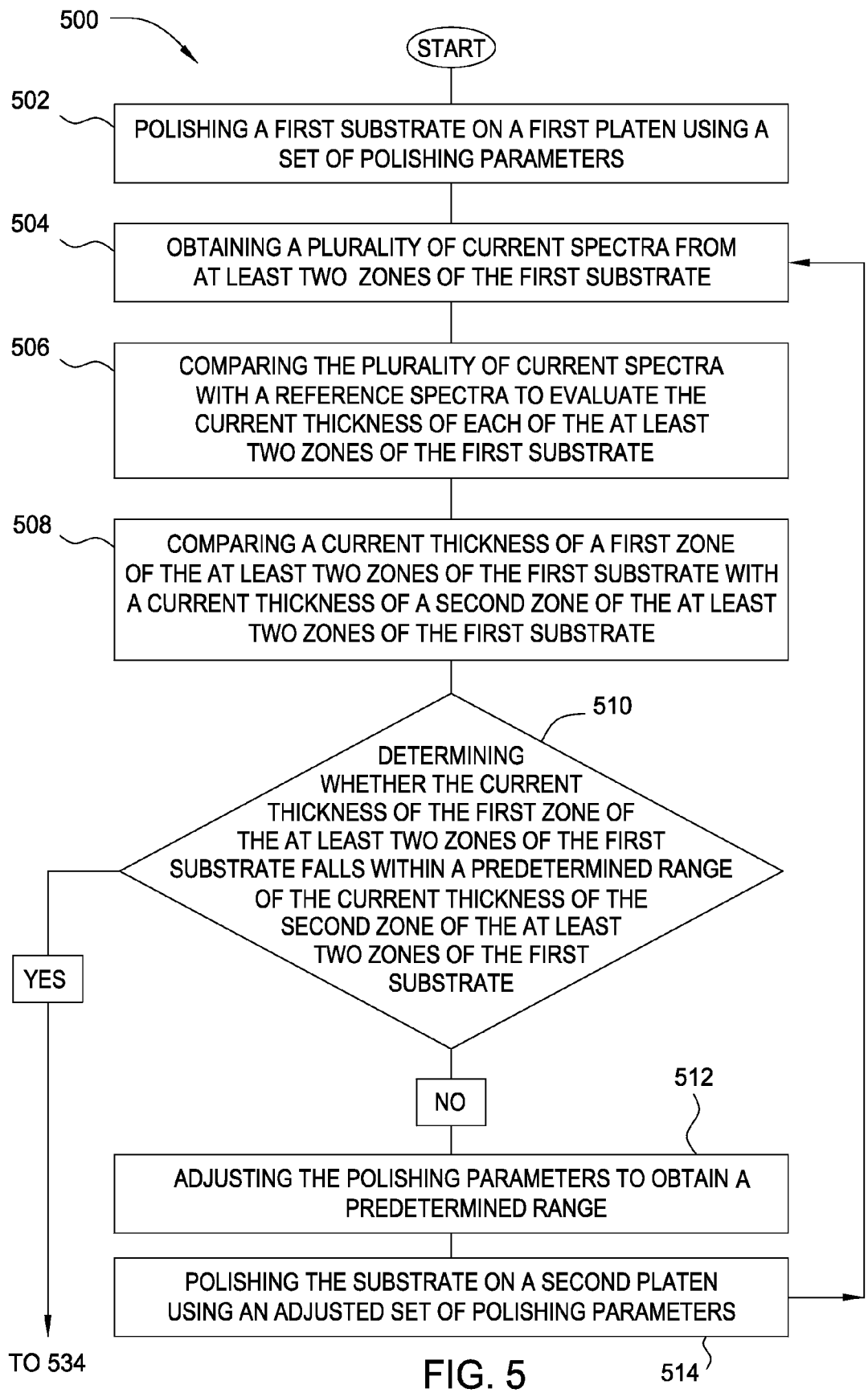
FIG. 5 illustrates another method for polishing a substrate.
Figure 5:
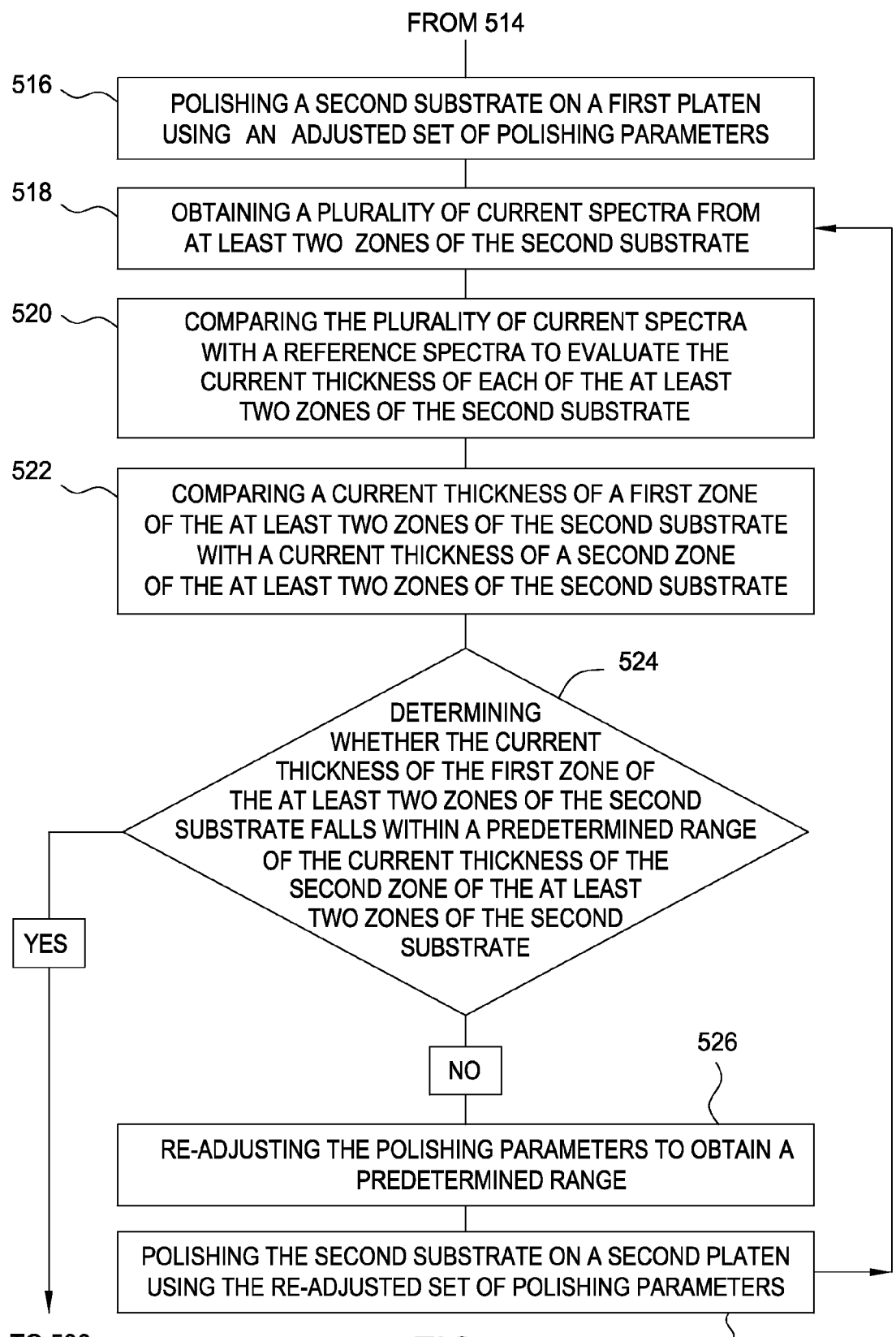
Figure 5:
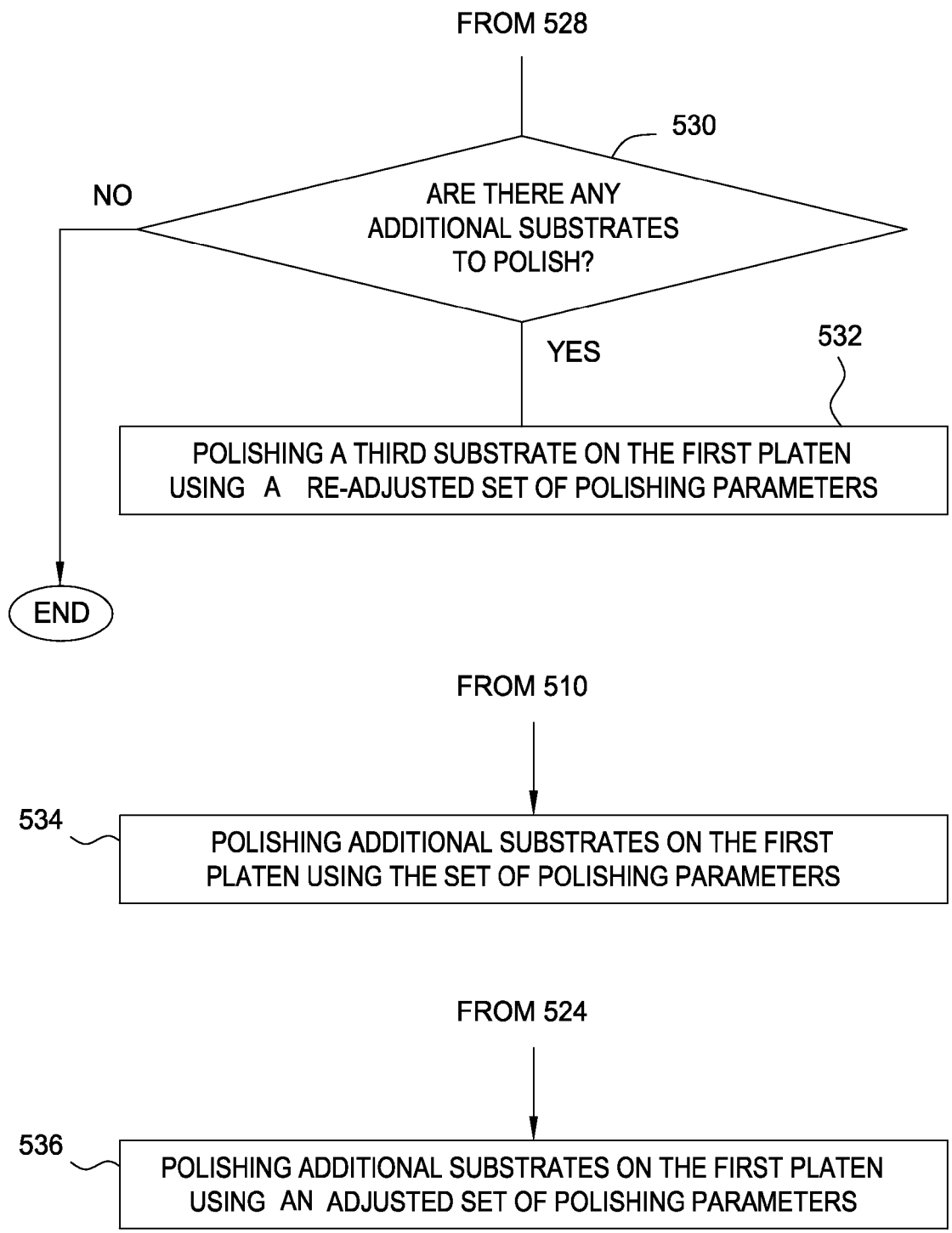

FIG. 5 illustrates another method 500 for polishing a substrate 10. This method can include the various possible implementations discussed above for method 400, but differs as set out below. The method begins by polishing a first substrate 10 on a first platen 24 using a first set of polishing parameters (step 502). A plurality of measured spectra is obtained from at least two zones of the first substrate 10 (step 504). The plurality of measured spectra is compared with a plurality of reference spectra to evaluate the thickness of each of the at least two zones of the first substrate 10 (step 506). A thickness of a first zone of the at least two zones of the first substrate is compared with a thickness of a second zone of the at least two zones of the first substrate (step 508). It is determined whether the thickness of the first zone of the at least two zones of the first substrate falls within a predetermined range of the thickness of the second zone of the at least two zones of the first substrate, e.g., whether the final thickness of the first zone falls within a predetermined range of the final thickness of the second zone (step 510). If the thickness of the first zone does not fall within the predetermined range, at least one parameter is adjusted to obtain a predetermined range (step 512). In particular, at least one parameter from a second set polishing parameters is adjusted from its default setting such that the final thickness of the control zone is equivalent to the final thickness of the reference zone at the completion of polishing of the substrate at the second platen. In addition, at least one parameter from the first set polishing parameters is adjusted such that the final thickness of the control zone is equivalent to the final thickness of the reference zone at the completion of polishing of a second substrate at the first platen. The first substrate 10 is polished on a second platen 24 using the adjusted second set of polishing parameters (step 514).

If the thickness of the first zone of the first substrate 10 falls within the predetermined range, additional substrates may be polished on the first platen using the first set of polishing parameters, and the substrate may be polished at the second platen using the default second set of polishing parameters (step 534).

A second substrate 10 is polished on the first platen 24 using the adjusted first set of polishing parameters (step 516). A plurality of measured spectra is obtained from at least two zones of the second substrate 10 (step 518). The plurality of measured spectra is compared with a plurality of reference spectra to evaluate the thickness of each of the at least two zones of the second substrate 10 (step 520). A thickness of a first zone of the at least two zones of the second substrate 10 is compared with a thickness of a second zone of the at least two zones of the second substrate (step 522). It is determined whether the thickness of the first zone of the at least two zones of the second substrate falls within a predetermined range of the thickness of the second zone of the at least two zones of the second substrate, e.g., whether the final thickness of the first zone falls within a predetermined range of the final thickness of the second zone (step 524).

If the thickness of the first zone of the second substrate 10 falls within the predetermined range, additional substrates may be polished on the first platen using the adjusted first set of polishing parameters (step 536).

If the thickness of the first zone of the second substrate 10 does not fall within the predetermined range, a set of polishing parameters is adjusted to obtain the predetermined range (step 526). In particular, at least one parameter from the second set of polishing parameters is adjusted from its default setting such that the final thickness of the control zone is equivalent to the final thickness of the reference zone at the completion of polishing of the second substrate at the second platen. In addition, at least one parameter from the first set of polishing parameters is re-adjusted such that the final thickness of the control zone is equivalent to the final thickness of the reference zone at the completion of polishing of a third substrate at the first platen. The second substrate 10 may be polished on the second platen 24 using the adjusted second set of polishing parameters (step 528).

If the thickness of the second substrate 10 meets the predetermined target thickness range, it is determined whether there are additional substrates to polish (step 530). If there are additional substrates to polish, a third substrate 10 is polished on the first platen 24 using the re-adjusted first set of polishing parameters (step 532).

EXAMPLES

The following non-limiting examples are provided to further illustrate implementations described herein. These examples can use the techniques described above. However, the examples are not intended to be all-inclusive and are not intended to limit the scope of the implementations described herein.

Feed Forward

For Feed Forward techniques, the polishing information obtained from polishing a first substrate on a platen (x) is used for determining the polishing parameters to obtain a uniform profile for the same substrate subsequently polished on a second platen (x+1). In some implementations, the Feed Forward techniques may be used to determine the incoming profile of a substrate. Feed Forward techniques may be used where additional substrates do not have an identical incoming profile as the first substrate.

Figures 6A, 6B:
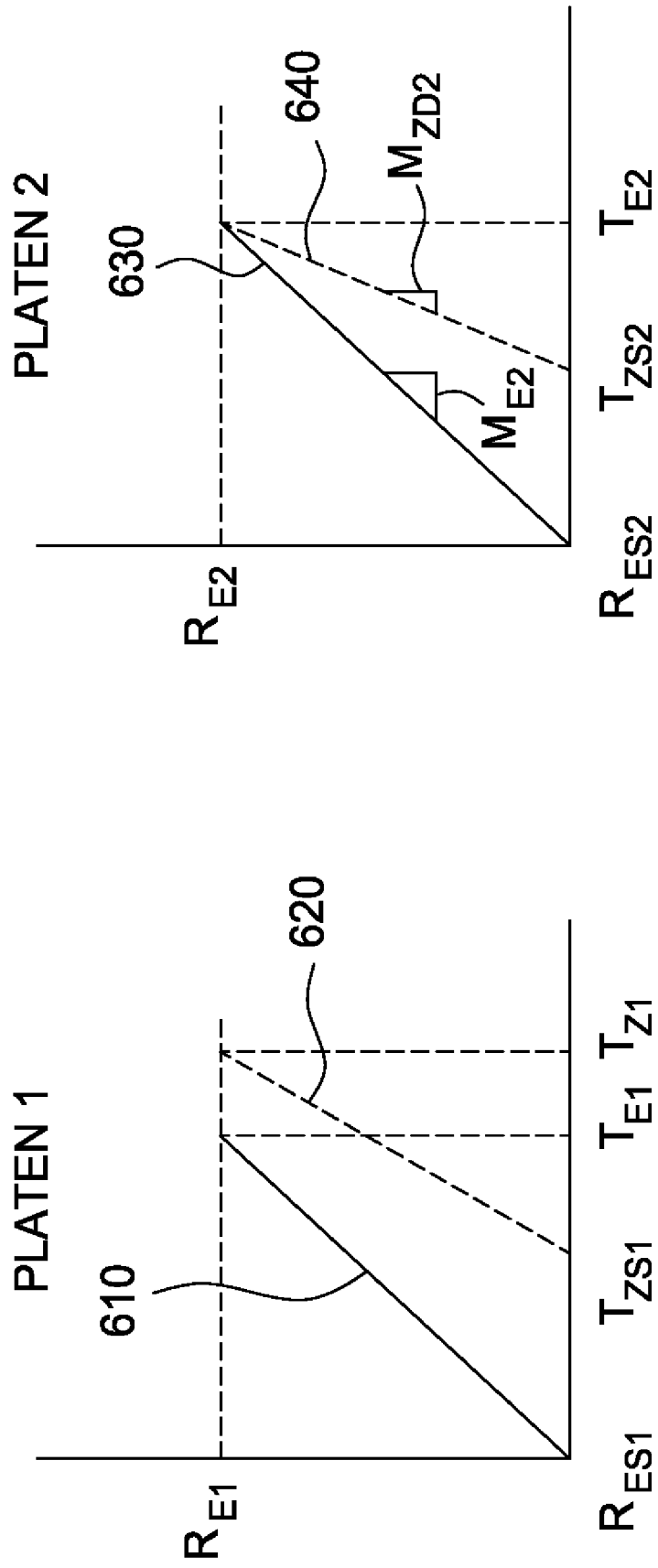
FIG. 6A illustrates a graph of polishing progress versus time for a process in which the polishing rates are adjusted.
FIG. 6B illustrates a graph of polishing progress versus time for a process in which the polishing rates are adjusted.

FIG. 6A illustrates a graph of the polishing progress versus time for a substrate polished on a first platen. FIG. 6B illustrates a graph of the polishing progress versus time for a process in which the polishing parameters for the substrate polished on a second platen are adjusted based on the information obtained from polishing the substrate on a first platen. Referring to FIG. 6A, if a particular profile is desired, such as a uniform thickness across the surface of the substrate, the slope of the polishing rate, as indicated by the change in index numbers (y-axis) according to time or platen rotations (x-axis), can be monitored and the polishing rate adjusted accordingly. Substrate 1 is polished on platen 1 and spectra are obtained. FIG. 6A illustrates the polishing information for a reference zone and a control zone on substrate 1. Here, the zones are circular and/or annular. Each spectrum is correlated to its respective index. This process is repeated over a number of platen rotations, or over time, and the polishing rate for each zone is determined. The polishing rate is indicated by the slope of the line that is obtained by plotting the index (y-axis) versus time (x-axis).

Referring to FIG. 6A, $R_{E1}$ represents the endpoint index value for the reference zone and $T_{E1}$ represents the time at which the endpoint for the reference zone is reached. Line 610 represents the robust fit line for the reference zone. $R_{ES1}$ represents the starting index value for the reference zone, $T_{ZS1}$ represents the actual polishing start time of the control zone of substrate 1 on platen 1, and $T_{Z1}$ represents the time that the control zone reaches the endpoint index value ($R_{E1}$). Line 620 represents the robust line fit for the control zone on the substrate. $T_{ZS1}$ represents the effective time that the control zone achieves the starting index value $R_{ES1}$ of the reference zone. Although the control zone stops polishing when line 620 reaches the endpoint time $T_{E1}$ for the reference zone, line 620 may be extrapolated to show where line 620 intersects with the endpoint index value $R_{E1}$, which is represented on the x-axis by $T_{Z1}$. The difference between $T_{Z1}$ and $T_{E1}$ represents the additional polishing time for the control zone to achieve the same thickness as the reference zone.

Referring to FIG. 6B, $R_{E2}$ represents the endpoint index value for the reference zone on platen 2 and $T_{E2}$ represents the time at which the endpoint for the reference zone is reached on platen 2. Line 630 represents a previously determined polishing progress for the reference zone, e.g., the robust line fit for the reference zone from polishing of a prior substrate, e.g., the test substrate using default polishing parameters. $M_{E2}$ is the slope of the line 630. $R_{ES2}$ represents the starting index value for the reference zone on platen 2, $T_{ZS2}$ represents the effective polishing start time for the control zone of substrate 1 on platen 2, i.e., the time at which the starting index value $R_{ES2}$ for the reference zone should be achieved by the control zone. Line 640 represents the desired polishing progress for the control zone and the reference zone to converge on $R_{E2}$ at the same time. $M_{ZD2}$ is the slope of the line 640.

The polishing process on platen 1 can be different than the polishing process on platen 2, for example, the polishing process on platen 1 polishes at a faster rate than the polishing process on platen 2. For example, it can take 20 rotations for platen 1 to remove 1000 Å of material, while it can take platen 2 40 rotations to remove 1000 Å of material. As a result of the differing polishing processes, the difference in thickness between the reference zone and the control zone from platen 1 is related to the difference in rotation rates between platen 1 and platen 2. $T_{ZS2}$ is calculated as follows: $((RR_2/RR_1)(T_{Z1}-T_{E1}))$ where $RR_1$ represents the rotation rate of platen 1, $RR_2$ represents the rotation rate of platen 2, and $T_{Z1}$ and $T_{E1}$ were both determined for platen 1. $M_{ZD2}$, the slope of line 640 which represents the desired polishing rate for the control zone to converge on $R_{E2}$, may be calculated as follows: $((R_{E2}/(T_{EZ}-T_{ZS2})))$. $P_{ZNEW}$, represents the polishing pressure that should be used on platen 2 to achieve a uniform polishing profile between the control zone and the reference zone, may be calculated as follows: $((M_{ZD2}/M_{E2})(P_{ZOLD}))$. In some implementations, $P_{ZOLD}$ represents polishing pressure used for polishing the reference zone on platen 2. In some implementations, $P_{ZOLD}$ represents the polishing pressure used for polishing the control zone on platen 1. In some implementations, $P_{ZOLD}$ represents a default the polishing pressure used for polishing the control zone on platen 2.

Feed Back

For Feed Back techniques, the polishing information obtained from polishing a first substrate on a platen is used for determining the polishing parameters to obtain a uniform profile for a second substrate subsequently polished on the platen. Feed Back techniques assume that the incoming substrate has the same incoming profile as the previous substrate.

Figure 7A:
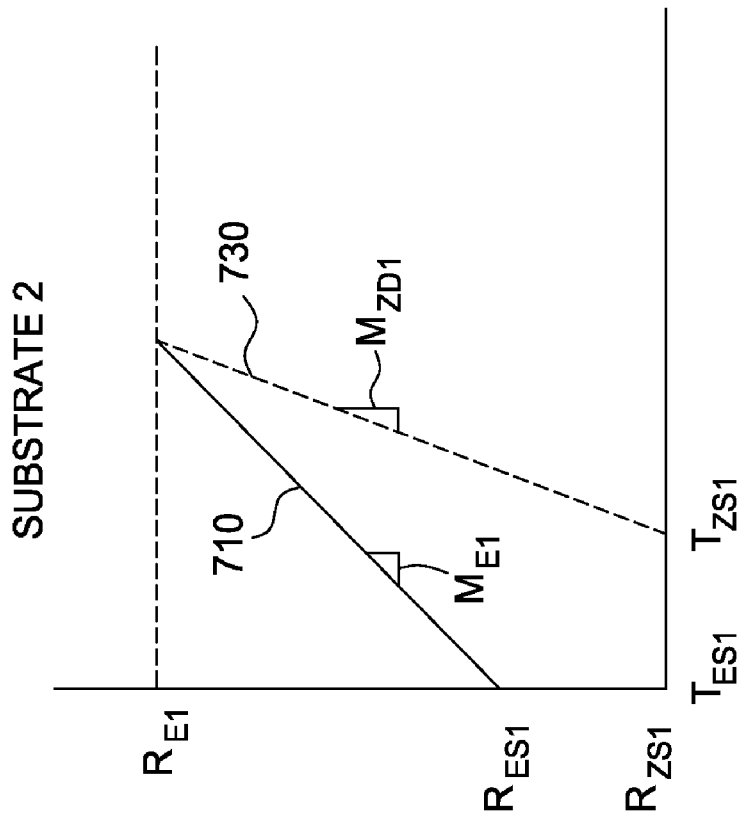
FIG. 7A illustrates a graph of the polishing progress versus time for a process in which the polishing rates are adjusted.
Figure 7B:
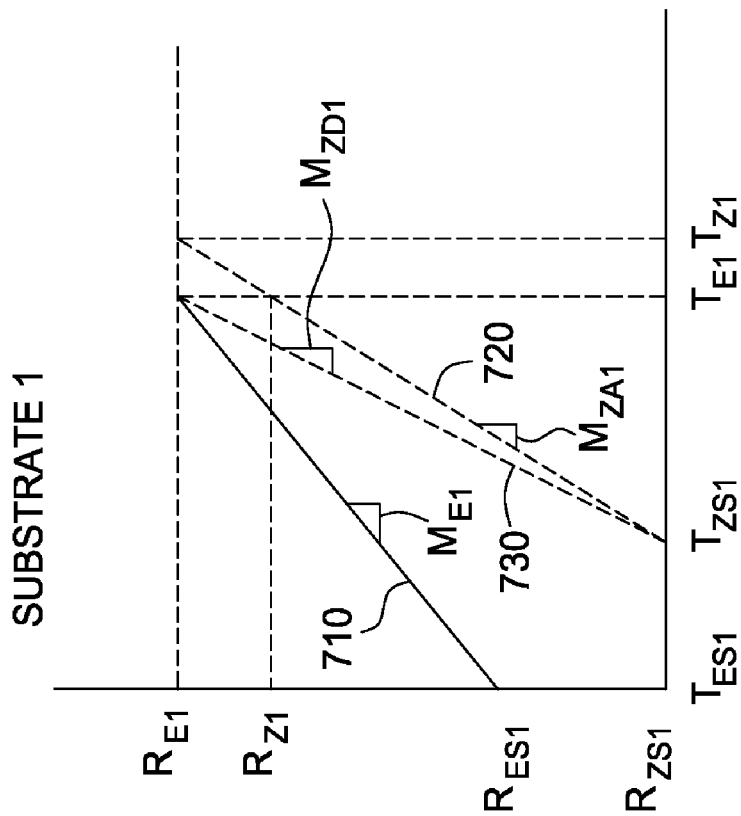
FIG. 7B illustrates a graph of the polishing progress versus time for a process in which the polishing rates are adjusted.

FIG. 7A illustrates a graph of the polishing progress versus time for a first substrate polished on a platen. FIG. 7B illustrates a graph of the polishing progress versus time for a process in which the polishing rates are adjusted for a second substrate polished on the platen. Referring to FIG. 7A, if a particular profile is desired, such as a uniform thickness across the surface of the substrate, the slope of the polishing rate, as indicated by the change in index numbers (y-axis) according to time or platen rotations (x-axis), can be monitored and the polishing rate adjusted accordingly. Substrate 1 is polished on platen 1 and spectra are obtained. Although the spectra may be obtained for multiple zones on the substrate, FIG. 7A shows the polishing information for a reference zone and a control zone. Here, the zones are annular or circular. Each spectrum is correlated to its respective index. This process may be repeated over a number of platen rotations, or over time, and the polishing rate for each zone is determined.

The polishing rate is indicated by the slope of the line that is obtained by plotting the index (y-axis) versus time (x-axis). Line 710 represents the robust fit line for the reference zone. The slope $M_{E1}$, determined from the slope of line 710, is the polishing rate of the reference zone on the substrate obtained during the polishing of substrate 1. $R_{ES1}$ represents the starting index value for the reference zone, $R_{E1}$ represents the target index value for the reference zone to halt polishing, $T_{ES1}$ represents the actual polishing start time of the reference zone, and $T_{E1}$ represents the time that the reference zone reaches the endpoint index value ($R_{E1}$). Line 720 represents the robust line fit for the control zone on the substrate. The slope $M_{ZA1}$, determined from the slope of line 720, is the actual polishing rate of the control zone on the substrate obtained during the polishing of substrate 1. $R_{ZS1}$ represents the starting index value for the control zone, $R_{A1}$ represents the index value of the control zone when polishing is halted, $T_{ZS1}$ represents the polishing start time for the control zone, and $T_{Z1}$ represents a projected time that the control zone would reach the target index value ($R_{E1}$). The slope $M_{ZD1}$, represented by line 730, is the desired polishing rate of the control zone such that the control zone converges on the endpoint index value ($R_{E1}$) of the reference zone at the time $T_{E1}$. Slope $M_{ZD1}$ represents the desired polishing rate in order to achieve the desired endpoint represented by the intersection of $R_{E1}$ and $T_{E1}$. Slope $M_{ZD1}$ can be calculated using the information obtained from $M_{E1}$ and $M_{ZA1}$. Specifically, the slope $M_{ZD1}$ can be calculated as $((R_{E1}-R_{ZS1})/(T_{E1}-T_{ZS1}))$.

Assuming an identical incoming profile for substrate 2 on platen 1, the polishing rate information from substrate 1 on platen 1 is fed backward and used to determine a new polishing pressure ($P_{ZNEW}$). $P_{ZNEW}$ represents the polishing pressure that the control zone of the second substrate should be polished at in order for the control zone to converge on the reference zone. $P_{ZNEW}$ is calculated as follows: $((M_{ZD1}/M_{ZA1}) \times P_{ZOLD})$ where $P_{ZOLD}$ represents the polishing pressure for the control zone on substrate 1. Polishing substrate 2 at $P_{ZNEW}$ provides a more uniform polish allowing the control zone to converge on the reference zone of substrate 2. Gain factors and other control techniques can be applied to dampen or amplify the new recommended pressure ($P_{ZNEW}$).

Feed Forward/Feed Back

Feed back techniques help compensate for changes in removal rates but do not account for differences in incoming thickness information. Feed forward techniques compensate for differences in incoming thickness on platen 2 but do not account for differences in removal rates. Therefore, in certain situations it is desirable to combine feed forward techniques with feed backward techniques to achieve a uniform polishing profile.

In some implementations, the new pressure $P_{NEW}$ for the control zone, e.g., at platen 2, is calculated as: $P_{NEW}=P_{INITIAL} P_{FB} P_{FF}$, where $P_{INITIAL}$ is a preset pressure for the control zone, e.g., a constant, e.g., the best-known-method (BKM) pressure, $P_{FB}$ is the feedback contribution to the pressure, and $P_{FF}$ is the feed-forward contribution to the pressure. $P_{FB}$ accounts for variations in the polishing rates of the zones due to process impacts, e.g., pad life, at the platen at which the substrate is being polished. $P_{FF}$ accounts for different incoming thickness variations between zones, e.g., as determined by optical monitoring at platen 1.

As discussed above, for each of the reference and control zones, lines can be fit to the sequence of values for the respective zones. In addition, as discussed above, the values can be index values and the time can be measured in platen rotations.

The feed back contribution $P_{FB}$ can be calculated as follows: $P_{FB}=k1*(P_{INITIAL})*((T_{C2}-T_{R2})/T_{C2})$, where k1 is a pre-defined constant, e.g., 1, $T_{R2}$ is the time that the fitted line for the reference zone crossed the target value for the previous substrate at platen 2, and $T_{C2}$ is the time or projected time that the fitted line for the control zone crossed the target value for the previous substrate at platen 2 (both $T_{C2}$ and $T_{R2}$ are relative to the start of polishing for the previous substrate at platen 2).

The feedback value can be weighted using common moving average or exponential weight moving average. An example of moving average (MA) calculation for the feedback contribution $P_{FB}(n+1)$ to the next substrate is the following: $MA[P_{FB}(n+1)]=\lambda P_{FB}(n)+(1-\lambda)MA[P_{FB}(n-1)]$, where is the newest feedback contribution, $P_{FB}(n)$ is a feedback contribution as calculated above for the current substrate, $P_{FB}(n-1)$, is the moving average feedback contribution for the previous substrate, and $\lambda$ is a constant.

The feed forward contribution $P_{FF}$ can be calculated as follows: $P_{FF}=k2*(P_{INITIAL})*((R_{C1}-R_{R1})/RR_2)/T_{C2}$, where k2 is a pre-defined constant, e.g., 1, $R_{R1}$ is the value of the fitted line for the reference zone for the substrate at the endpoint time at platen 1, e.g., the target value at platen 1, $R_{C1}$ is the value or projected value for the fitted line for the control zone at the endpoint time for the substrate at platen 1, and $RR_2$ is the rotation rate of platen 2 (both $R_{C1}$ and $R_{R1}$ can be relative to the value of the reference zone at the start of polishing at platen 1).

The methods and functional operations described in this specification can be implemented in digital electronic circuitry, or in computer software, firmware, or hardware, including the structural means disclosed in this specification and structural equivalents thereof, or in combinations of them. The methods and functional operations can be performed by one or more computer program products, i.e., one or more computer programs tangibly embodied in an information carrier, e.g., in a computer readable media, such as a machine readable storage device, or in a propagated signal, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The substrate can be, for example, a product substrate (e.g., which includes multiple memory or processor dies), a test substrate, and a gating substrate. The substrate can be at various stages of integrated circuit fabrication, e.g., the substrate can include one or more deposited and/or patterned layers. The term substrate can include circular disks and rectangular sheets. The deposited and/or patterned layers can include insulative materials, conductive materials, and combinations thereof. In implementations where the material is an insulative material, the insulative material can be an oxide, e.g., silicon oxide, a nitride, or another insulative material used in the industry to produce electronic devices. In implementations where the material is a conductive material, the conductive material can be a copper containing material, tungsten containing material, or another conductive material used in the industry to produce electronic devices.

While the foregoing is directed to various implementations, other and further implementations may be devised, and the scope of the invention is determined by the claims that follow.

The invention claimed is:

1. A method of controlling the chemical mechanical polishing of a substrate, comprising:
    polishing a substrate on a first platen using a first set of polishing parameters;
    obtaining a first sequence of measured spectra with an in-situ optical monitoring system, each measured spectrum from the first sequence of measured spectra being a spectrum of light reflected from a first region of the substrate;
    generating a first sequence of values from the first sequence of measured spectra;
    fitting a first linear function to the first sequence of values;
    obtaining a second sequence of measured spectra with the in-situ optical monitoring system, each measured spectrum from the second sequence of measured spectra being a spectrum of light reflected from a second region of the substrate;
    generating a second sequence of values from the second sequence of measured spectra;
    fitting a second linear function to the second sequence of values;
    determining a difference between the first linear function and the second linear function;
    adjusting at least one polishing parameter of the first set of polishing parameters based on the difference so as to reduce an expected difference between an expected first linear function for the first region and an expected second linear function for the second region during polishing of a second substrate on the first platen; and
    polishing the second substrate on the first platen using the adjusted polishing parameter.

2. The method of claim 1, wherein first region comprises a control region and the second region comprises a reference region, and polishing of the first substrate at the first platen is halted based on the second linear function reaching a target value.

3. The method of claim 2, wherein determining the difference comprises determining a first difference between a first time that the first linear function crosses a starting value and a second time that the second linear function reaches the target value.

4. The method of claim 3, wherein determining the difference further comprises determining a second difference between the target value and the starting value.

5. The method of claim 4, wherein the polishing parameter is pressure.

6. The method of claim 5, wherein adjusting the at least one polishing parameter includes calculating a desired polishing rate for the second substrate at the first platen from the first difference and the second difference.

7. The method of claim 6, wherein $MZD1=(RE1-RSZ1)/(TE1-TZS1)$, where MZD1 is the desired polishing rate, RE1 is the target value, RSZ1 is the starting value, TE1 is the second time that the second linear function reaches the target value, and TZS1 is the first time that the first linear function crosses the starting value.

8. The method of claim 7, wherein adjusting the polishing rate comprises multiplying a pressure by a ratio of the desired polishing rate for the second substrate at the first platen to the polishing rate of the substrate at the first platen.

9. The method of claim 8, wherein the pressure is the prior pressure for the control region for polishing of the first substrate.

10. The method of claim 2, wherein adjusting the at least one polishing parameter comprises adjusting a polishing parameter for the control region.

11. The method of claim 2, wherein the difference in time is measured as a difference in platen rotations.

12. The method of claim 1, wherein generating the first sequence of values comprises, for each measured spectrum from the first sequence, determining a best fitting reference spectrum from a library of reference spectra, and determining a value associated with the best fitting reference spectrum.

13. The method of claim 12, wherein the value comprises an index value.

14. The method of claim 12, wherein the value comprises a thickness value.

15. The method of claim 12, wherein generating the second sequence of values comprises, for each measured spectrum from the second sequence, determining a best fitting reference spectrum from a library of reference spectra, and determining a value associated with the best fitting reference spectrum.

16. The method of claim 1, wherein obtaining a plurality of measured spectra from at least two zones of the substrate includes illuminating the substrate with white light and obtaining spectra of light reflected from the substrate.

17. A computer program product, tangibly embodied on a computer readable media, comprising instructions for causing a processor to control a chemical mechanical polisher to perform operations of:
  polishing a substrate on a first platen using a first set of polishing parameters;
  obtaining a first sequence of measured spectra with an in-situ optical monitoring system, each measured spectrum from the first sequence of measured spectra being a spectrum of light reflected from a first region of the substrate;
  generating a first sequence of values from the first sequence of measured spectra;
  fitting a first linear function to the first sequence of values;
  obtaining a second sequence of measured spectra with the in-situ optical monitoring system, each measured spectrum from the second sequence of measured spectra being a spectrum of light reflected from a second region of the substrate;
  generating a second sequence of values from the second sequence of measured spectra;
  fitting a second linear function to the second sequence of values;
  determining a difference between the first linear function and the second linear function;
  adjusting at least one polishing parameter of the first set of polishing parameters based on the difference so as to reduce an expected difference between an expected first linear function for the first region and an expected second linear function for the second region during polishing of a second substrate on the first platen; and
  polishing the second substrate on the first platen using the adjusted polishing parameter.

18. The computer program product of claim 17, wherein the first region comprises a control region and the second region comprises a reference region, and polishing of the first substrate at the first platen is halted based on the second linear function reaching a target value, and wherein adjusting the polishing rate comprises calculating a desired polishing rate, wherein MZD1=(RE1−RSZ1)/(TE1−TZS1), where MZD1 is the desired polishing rate, RE1 is the target value, RSZ1 is a starting value, TE1 is the time that the second linear function reaches the target value, and TZS1 is the time that the first linear function crosses the starting value, and multiplying a pressure by a ratio of the desired polishing rate for the second substrate at the first platen to the polishing rate of the substrate at the first platen.

19. The computer program product of claim 17, wherein generating the first sequence of values comprises, for each measured spectrum from the first sequence, determining a best fitting reference spectrum from a library of reference spectra, and determining a value associated with the best fitting reference spectrum, and wherein generating the second sequence of values comprises, for each measured spectrum from the second sequence, determining a best fitting reference spectrum from a library of reference spectra, and determining a value associated with the best fitting reference spectrum.

20. The method of claim 17, wherein the value comprises an index value.

21. A system for chemical mechanical polishing, comprising:
  a first rotatable platen for supporting a polishing surface;
  a light source in the platen;
  a light detector in the platen;
  a carrier head configured to hold a substrate against the polishing surface and move the substrate so that light from the light source is directed onto the surface of the substrate and light reflected from the substrate is detected by the light detector; and
  a controller configured to receive a signal from the light detector, wherein the controller is further configured to
    obtaining a first sequence of measured spectra, each measured spectrum from the first sequence of measured spectra being a spectrum of light reflected from a first region of the substrate,
    generate a first sequence of values from the first sequence of measured spectra,
    fit a first linear function to the first sequence of values,
    obtain a second sequence of measured spectra with the in-situ optical monitoring system, each measured spectrum from the second sequence of measured spectra being a spectrum of light reflected from a second region of the substrate,
    generate a second sequence of values from the second sequence of measured spectra,
    fit a second linear function to the second sequence of values,
    determine a difference between the first linear function and the second linear function,
    adjust at least one polishing parameter of the first set of polishing parameters based on the difference so as to reduce an expected difference between an expected first linear function for the first region and an expected second linear function for the second region during polishing of a second substrate on the first platen, and
    polish the second substrate on the first platen using the adjusted polishing parameter.

22. The system of claim 21, wherein the first region comprises a control region and the second region comprises a reference region, and polishing of the first substrate at the first platen is halted based on the second linear function reaching a target value, and wherein adjusting the polishing rate comprises calculating a desired polishing rate, wherein MZD1=(RE1−RSZ1)/(TE1−TZS1), where MZD1 is the desired polishing rate, RE1 is the target value, RSZ1 is a starting value, TE1 is the time that the second linear function reaches the target value, and TZS1 is the time that the first linear function crosses the starting value, and multiplying a pressure by a ratio of the desired polishing rate for the second substrate at the first platen to the polishing rate of the substrate at the first platen.

23. The system of claim 21, wherein generating the first sequence of values comprises, for each measured spectrum from the first sequence, determining a best fitting reference spectrum from a library of reference spectra, and determining a value associated with the best fitting reference spectrum, and wherein generating the second sequence of values comprises, for each measured spectrum from the second sequence, determining a best fitting reference spectrum from a library of reference spectra, and determining a value associated with the best fitting reference spectrum.

24. The system of claim 21, wherein the value comprises an index value.

* * * * *

UNITED STATES PATENT AND TRADEMARK OFFICE
CERTIFICATE OF CORRECTION

| | |
|---|---|
| PATENT NO. | : 8,292,693 B2 |
| APPLICATION NO. | : 12/625480 |
| DATED | : October 23, 2012 |
| INVENTOR(S) | : Jeffrey Drue David |

It is certified that error appears in the above-identified patent and that said Letters Patent is hereby corrected as shown below:

In Claim 20, column 22, line 19, delete "method" and insert -- computer program product --, therefor.

Signed and Sealed this
Fifteenth Day of January, 2013

David J. Kappos
*Director of the United States Patent and Trademark Office*